United States Patent [19]

Kikinis

[11] Patent Number: 5,502,838

[45] Date of Patent: Mar. 26, 1996

[54] TEMPERATURE MANAGEMENT FOR INTEGRATED CIRCUITS

[75] Inventor: Dan Kikinis, Saratoga, Calif.

[73] Assignee: Consilium Overseas Limited, Geneva, Switzerland

[21] Appl. No.: 234,344

[22] Filed: Apr. 28, 1994

[51] Int. Cl.$^6$ ................................................. G06F 17/40
[52] U.S. Cl. ................... 395/550; 364/264.5; 364/270.2; 364/232.8; 364/DIG. 1
[58] Field of Search ............................................... 395/550

[56] References Cited

U.S. PATENT DOCUMENTS

| | | | |
|---|---|---|---|
| 4,092,693 | 5/1978 | Ishikawa et al. | 361/103 |
| 4,625,128 | 11/1986 | Boeckmann | 327/512 |
| 4,918,505 | 4/1990 | Blouke et al. | 257/244 |
| 5,094,546 | 3/1992 | Tsuji | 374/178 |
| 5,287,292 | 2/1994 | Kenny et al. | 395/550 |
| 5,315,214 | 5/1994 | Lesea | 315/307 |
| 5,359,234 | 10/1994 | Atriss et al. | 307/651 |

*Primary Examiner*—Kevin A. Kriess
*Assistant Examiner*—John Q. Chavis
*Attorney, Agent, or Firm*—Donald R. Boys

[57] ABSTRACT

A system for controlling temperature buildup in an IC employs a temperature sensor to provide an indication of the IC temperature to a control circuit which is configured to provide an operational clock rate to the IC which is less than the system clock rate, based on a function of the temperature of the IC or its package. In one embodiment temperature sensors are implemented as solid-state circuitry within different functional areas of a single IC, such as a microprocessor, In other embodiments, operating voltage is lowered as operating frequency is lowered. In yet another embodiment temperature sensing of multiple processors in a system is provided to a controller or controllers which are configured to allocate workload between the processors as a means to limit temperature rise, as well as to lower operational clock rate and to lower operating voltage.

13 Claims, 6 Drawing Sheets

TEMPERATURE MANAGEMENT FOR INTEGRATED CIRCUITS

FIELD OF THE INVENTION

This invention is ill the area of integrated circuits (ICs) and pertains more specifically to apparatus and methods for controlling the generation of waste heat within ICs while conserving power and maintaining an acceptable level of performance.

BACKGROUND OF THE INVENTION

Integrated circuits are electrical systems comprising solid-state switches (transistors) connected by thin-film conductive traces. Heat is generated by large numbers of transistors in a small area, switching at high frequency. High-frequency switching is a major factor in the generation of heat, because the absolute current flow is proportional to frequency.

There has long been a trend to higher and higher density in IC development, and this trend contributes to heat generation as well. Another factor is associated with use and placement of ICs in circuitry. The high density motivation extends to higher-level circuitry, such as printed circuit boards. In addition, there has long been a trend in the industry to smaller and smaller products, such as the development of laptop computers after desktop units, then notebook computers, then palmtop computers, and recently even smaller units called personal digital assistants.

All of the developments described above lead to increasing difficulty in dissipating the heat generated from IC operation. If heat generated is not disposed of, temperature rises, and if a balance is not reached between heat generation and heat dissipation, temperature may rise to a point where performance is degraded, and even to a point where physical damage may occur. The problems of heat generation and resulting temperature rise are compounded by the fact that, for most materials, resistance increases with temperature.

The problems of heat generation and resulting temperature increase described above apply in particular to microprocessors, and certain characteristics of such temperature problems, though not limited to microprocessors, can be effectively demonstrated and addressed through reference to microprocessors.

Figure 1:
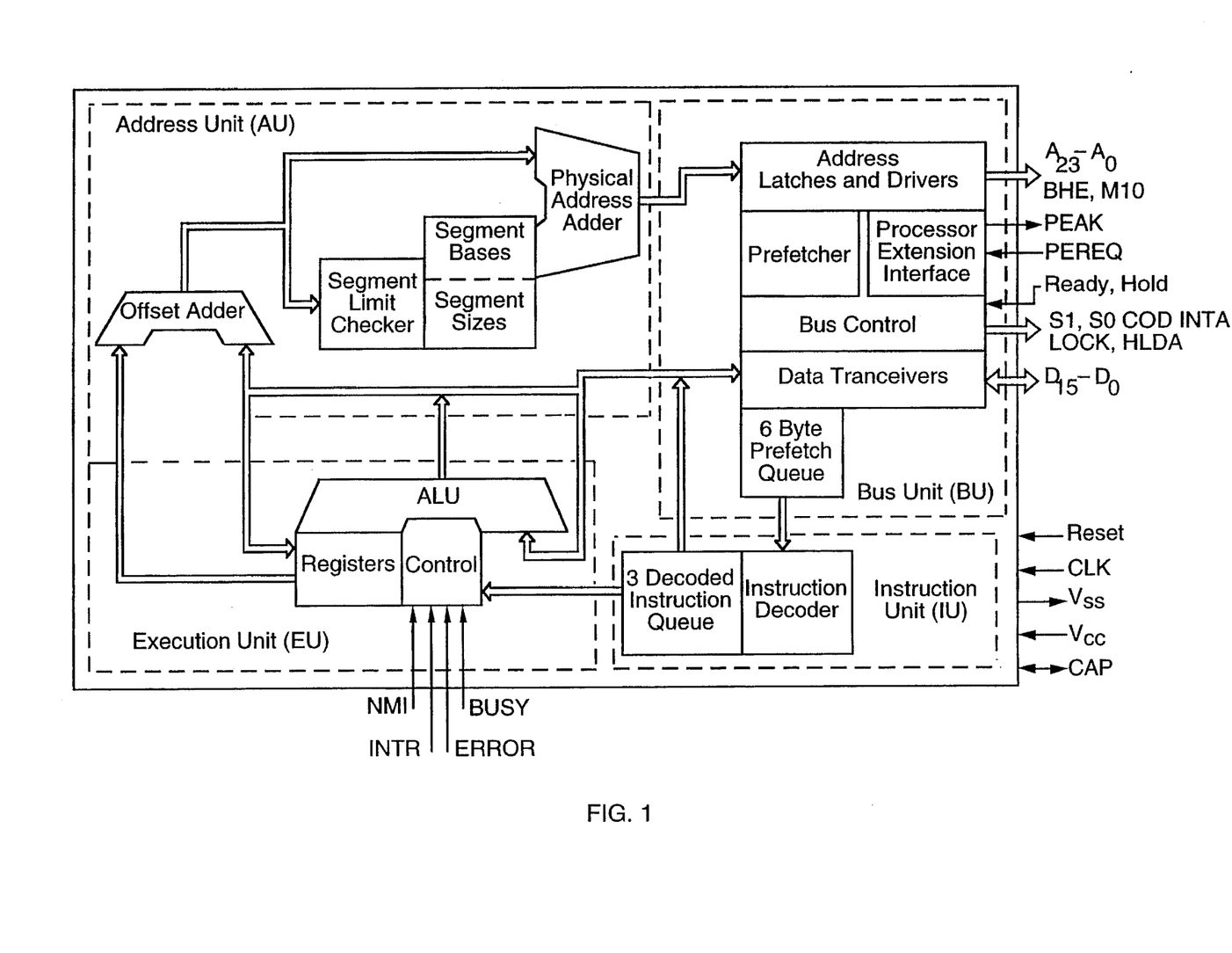
FIG. 1 is a somewhat simplified block diagram of a microprocessor.

FIG. 1 is a somewhat simplified block diagram of a microprocessor comprising several functional units. There are an address unit AU), an execution unit (EU), a bus communication unit BU), and an instruction unit (IU), all connected through address, data, and control buses. This functional-unit architecture is typical of microprocessors, and state-of-the-art microprocessors are generally more complex than that shown in FIG. 1.

Functional units in a microprocessor are typically not used equally. For example, a math-intensive application uses the computational functional unit or units more than other functional units in the microprocessor. As another example, some applications are more memory intensive, or may use logic units to a greater extent. As a result of this unequal utilization, some regions of a CPU generate heat, and therefore tend to increase in temperature, faster than other regions.

Unequal use of regions of a microprocessor can produce hot-spots greatly influencing mechanical stresses in an IC die. ICs are typically manufactured by techniques of layering and selective removal of different materials, so uneven heating may create stresses and flexure because of differing thermal expansion rates for the different materials. The induced stresses and movement can result in micro cracking and fatigue failure.

What is needed is a system implemented on ICs, such as microprocessors, for managing power dissipation to maintain acceptable levels of ICs performance and structural integrity.

SUMMARY OF THE INVENTION

In an embodiment of the present invention, in an integrated circuit (IC) having distinct functional areas, a system is provided for controlling power dissipation in at least one functional area, comprising a temperature sensor in contact with the controlled functional area, and clock adjustment circuitry connected to the controlled functional area for providing an operational clock rate based on the system clock rate for operating the controlled functional area. There is also control circuitry connected to the temperature sensor and to the clock adjustment circuitry, configured for driving the clock adjustment circuitry to provide the operational clock rate as a function of a temperature indication provided by the temperature sensor.

In a preferred embodiment the IC is a microprocessor, and multiple functional units are separately provided with individual operational clock rate based on the system clock rate and the temperature of each functional area. In yet another embodiment, plural microprocessors in a computer system are managed relative to computational and logic load, clock rate, and operating voltage, based on temperature indications from sensors mounted to the IC packages containing the microprocessors.

DESCRIPTION OF THE PREFERRED EMBODIMENTS

Figure 2:
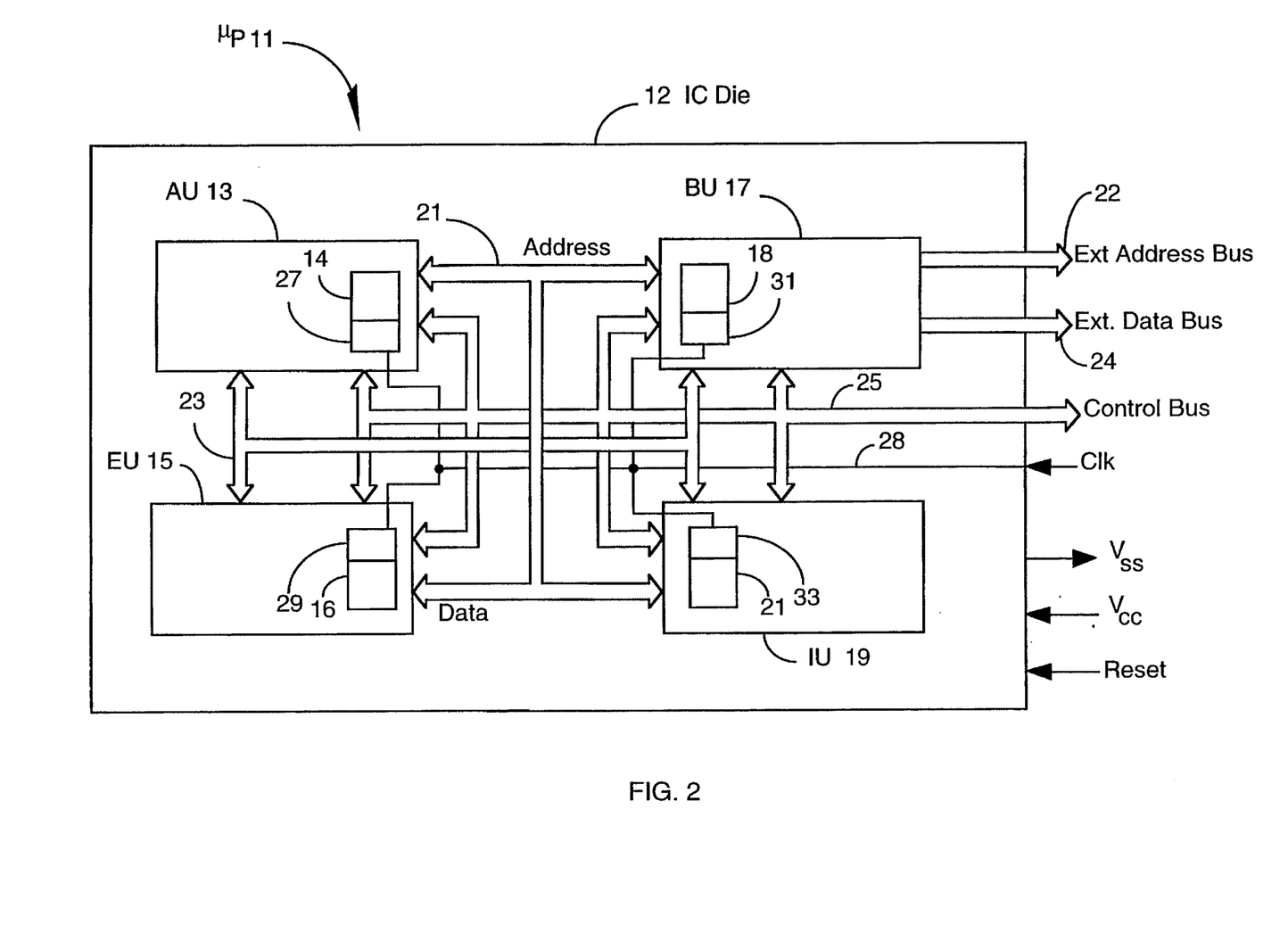
FIG. 2 is a block diagram of a microprocessor according to an embodiment of the present invention.

FIG. 2 is a block diagram of a microprocessor 11 according to an embodiment of the present invention. Microprocessor 11 comprises an address unit (AU) 13, an execution unit (EU 15, a bus communication unit (BU) 17, and an instruction unit (IU) 19 arranged on a single IC die 12. An address bus 21, a data bus 23 and a control bus 25 interconnect the four functional units. There are also external bus connections that link the microprocessor to other elements (not shown), such as external address bus 22 and external data bus 24. Clock, reset, and power connections are also shown, as typical external connections, though the connections shown are not all of the connections that might be made to the microprocessor.

There are commonalities among the operations of most microprocessor systems. A microprocessor, for example, typically reads an instruction, executes an operation and then reads the next instruction. Bus systems distribute work load between the dedicated functional units both on- and off-chip, according to demand. The clock rate is provided to functional circuitry on all regions of the microprocessor.

In various embodiments of the present invention, temperature-sensing circuitry is provided in the separate regions on the microprocessor IC where different functional units reside, and clock rate to the sensed regions is controlled accordingly to manage the rate of heat generation in each sensed region.

In the microprocessor of FIG. 2, each of the four functional units shown has a temperature sensing circuit. Temperature sensing circuit 14 serves address unit 13, circuit 16 serves execution unit 15, circuit 18 serves bus communication unit 17, and circuit 21 serves instruction unit 19.

There are a number of ways temperature may be indirectly sensed by solid state circuits designed into microprocessor functional regions. For example, circuitry may be incorporated in a functional unit area to respond to test signals according to the temperature of circuit elements. Temperature affects physical and electrical characteristics of materials. As a simple example, because resistance of materials changes in known ways according to temperature fluctuations, a circuit might be included in a functional region with one or more resistor elements, and current and/or voltage changes in response to a known input may be measured as an indication of temperature change. Another way an indication of temperature may be obtained is by including a circuit in each functional area wherein the rate of signal propagation may be measured as an indication of temperature. Yet another way is to incorporate an oscillator circuit arranged in a manner to exhibit a frequency varying with temperature. Various forms of circuitry for indirect measurement of temperature are known in the art, and it will be apparent to those with skill in the art that temperature may be monitored for a semiconductor circuit indirectly in a number of different ways, and the measurements related empirically to temperature.

In the embodiment of the invention depicted in FIG. 2, a clock control circuit is provided as a part of each functional region, and clock line 28 is connected to each instance of clock control circuitry. The clock rate supplied to each region may be altered in response to temperature sensed. Clock control circuit 27 serves address unit 13, clock control circuit 29 serves execution unit 15, clock control circuit 31 serves bus communication unit 17, and clock control circuit 33 serves instruction unit 19.

Circuitry for altering clock rate is also well known in the art, and is commonly used, for example, to divide oscillator rate to drive separate elements in computers, such as processors and bus structures, at specific rates slower than the operating frequency of the system CPU microprocessor of a general-purpose computer system. In a simple form, each clock control circuit in the embodiment shown in FIG. 2 could be a divider circuit externally selectable to pass the full clock rate to the region served, or to divide the clock rate by two.

In other embodiments, circuitry may be provided at each functional unit to divide and manipulate the originally provided clock rate in other ways to provide a lower rate to one or another functional region. Such control circuitry might simply block a portion of the clock signals to the functional unit, so the overall average clock cycle is lowered. Blocking one signal in ten, or ten in a hundred, for example, will result in a 10% reduction in average clock rate to a unit.

There are a wide variety of ways control may be provided for managing temperature to different functional areas on a single IC. In the embodiment of FIG. 2, logic for control is incorporated in the clock control circuit at each functional unit, and simple control routines cycle continuously (while the microprocessor is on and active) at each unit to adjust clock rate according to one or more pre-programmed threshold temperature indications.

In other embodiments, control logic may be in a separate on-chip area (not shown in FIG. 2) with control signals provided to clock control circuitry either at each functional unit or implemented separately from each functional unit. That is, there may be a unique functional unit to provide separate clock signals at a frequency different from frequencies of the other functional units, in response to temperature-related signals from sensor circuitry at each functional unit.

In yet another embodiment, logic and/or clock control circuitry may be implemented off-chip, in a separate controller.

Figure 3:
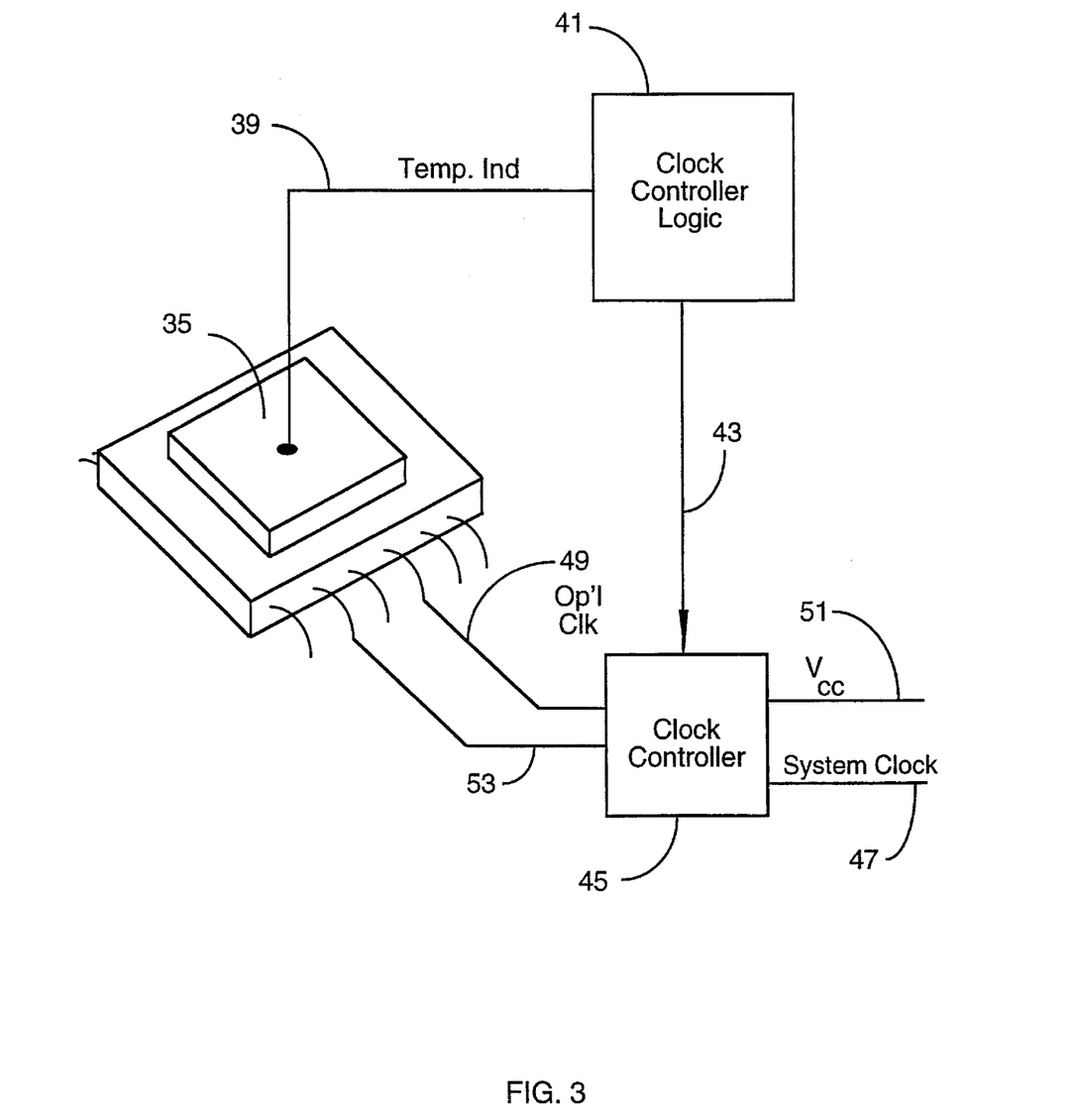
FIG. 3 is a block diagram illustrating an alternative embodiment of the present invention.

FIG. 3 is a block diagram showing an alternative embodiment of the present invention wherein a temperature sensor 35 is mounted on an external surface of an IC package 37, such as might house a microprocessor. An indication of temperature is delivered via line 39 to a logic control element 41, wherein control routines, using the indication of temperature on line 39 as a reference, output control signals on a control line 43 to a clock control circuit 45. Clock control circuit 45 alters the incoming system clock signal on line 47 to a lower frequency on line 49 to IC package 37.

The control routines may vary widely in nature and scope, and the temperature threshold or thresholds at which action is taken to reduce clock rate may be programmable. In one scheme, a threshold is set at some temperature below the temperature at which performance would be degraded, so a small reduction in the clock rate can limit the temperature increase before the critical temperature is reached.

There may be, in the control routines, multiple thresholds at which more and more drastic clock reductions are implemented. For example, an exemplary control routine might decrease the clock rate by 10% at a first temperature, then a further 10% for each increase in temperature of a specified $\Delta T$. If $\Delta T$ is 10° C., for example, at the first threshold the control routines would decrease the clock rate to the chip by 10%, then by an additional 10% for each 10° C. temp rise. The 10% may be either of the original clock rate, or the real-time rate clock rate. Of course, as temperature falls, the same control routines would increase the clock rate to the chip for each 10° C. drop in temperature, until the clock rate is again 100% of the system rate on line 47.

In another aspect of the invention, controller 47 is configured to control power to the chip as well as clock rate. In this case, referring to FIG. 3, the system voltage for IC circuitry, $V_{CC}$, is an input to controller 45, and controller 45 provides power at the system voltage or a reduced voltage to IC package 37 on line 53. When the clock rate is slowed, the voltage is also decreased, resulting in a further power saving. This feature of the invention may be employed down to a threshold voltage considered safe for operation at the reduced clock rate.

Figure 4:
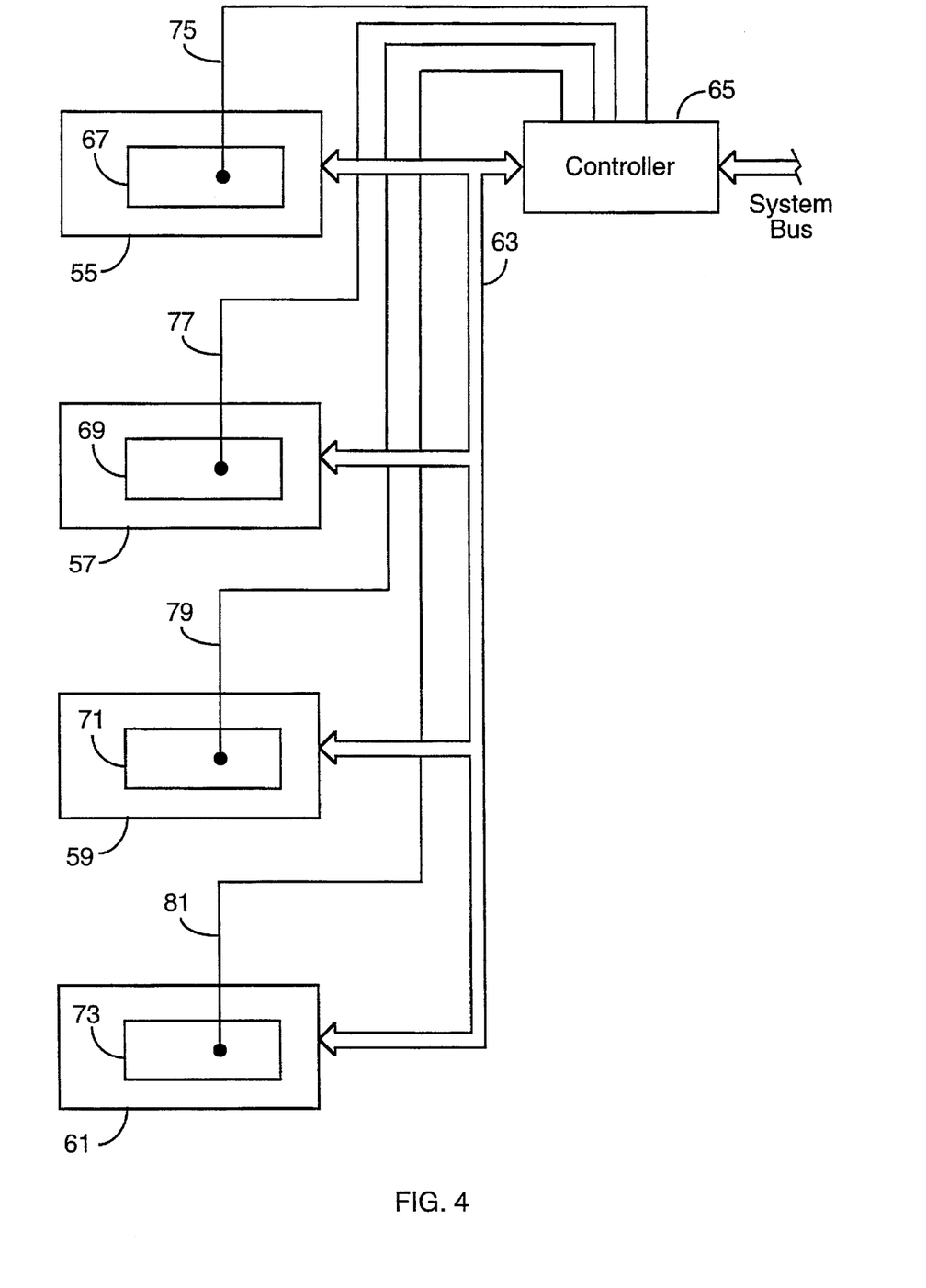
FIG. 4 is a block diagram illustrating an embodiment providing task management for multiple processors.

FIG. 4 is a block diagram showing four microprocessor packages 55, 57, 59, and 61 associated with a bus 63, wherein a controller chip (or chip set) 65 may control access to the four microprocessors. In the multi-processor system, many procedures initiated by the system CPU may be performed by any one of the four parallel processors. The number of processors in this example is arbitrary. It could be as few as two, or many more than the four shown.

Each microprocessor package has a temperature sensor mounted in a manner to sense the temperature of each individual microprocessor package. In this case, temperature sensor 67 is mounted on package 55, sensor 69 on package 57, sensor 71 on package 59, and sensor 73 on package 61. Each sensor reports separately to controller 65, providing an input whereby the controller may shift computational and logic load from one microprocessor package to another, providing load management to limit temperature rise.

Figure 5:
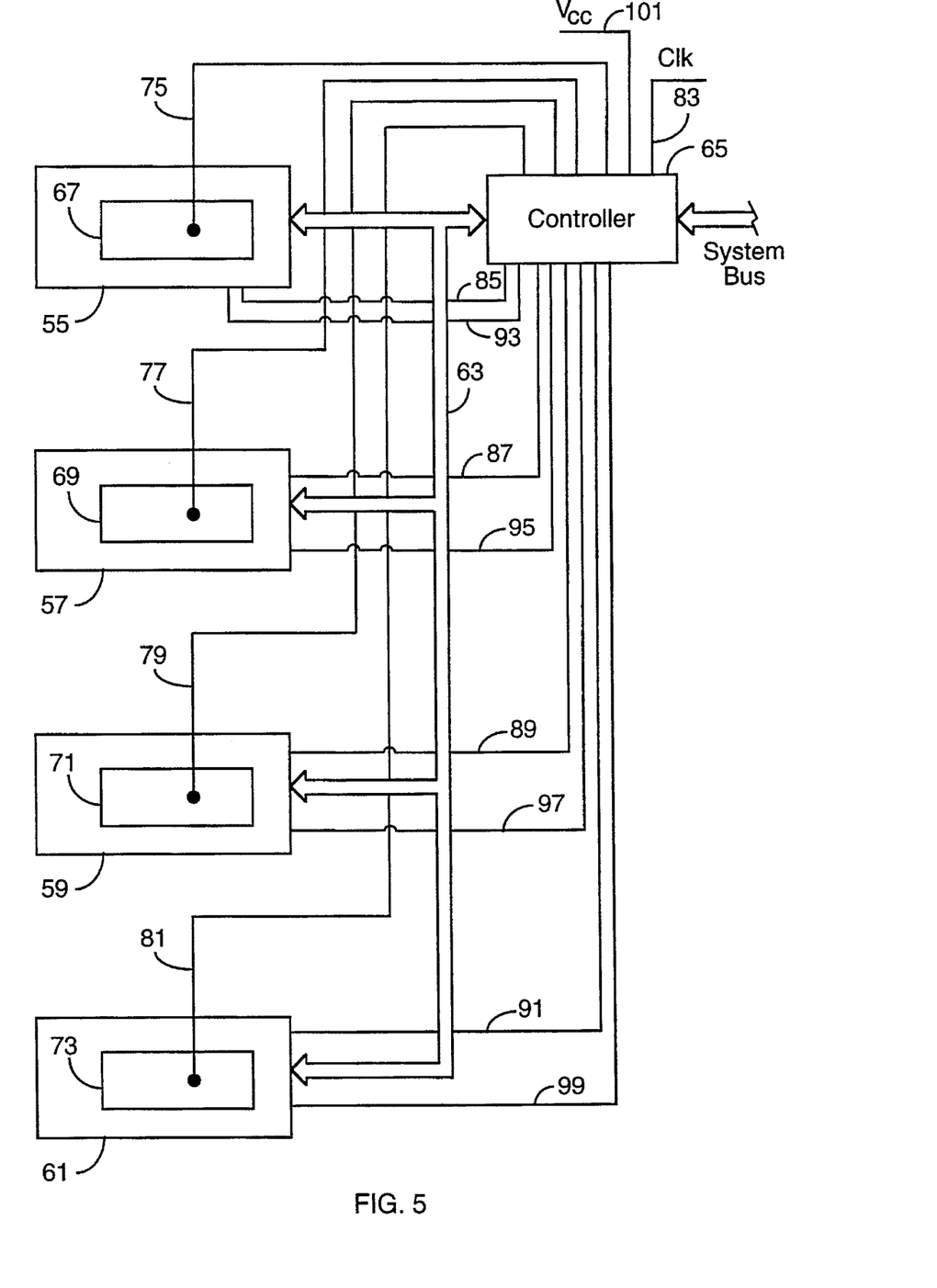
FIG. 5 is a block diagram illustrating an alternative embodiment providing power management and clock rate management as well as task management.

In a further embodiment, controller 65 may also control clock rates to the multiple processors, as illustrated by FIG. 5. In this embodiment, controller 65 not only manages computational and logic load to each of the processors based on temperature, but also controls the clock rate to each processor. The system clock rate is provided to controller 65 on line 83, and controller 65 provides the system rate or a reduced rate to each of the multiple processors via lines 85, 87, 89, and 9I, based on the temperature indicated by each sensor at each processor.

In yet a further embodiment, controller 65 may control operating voltage to each processor via lines 93, 95, 97, and 99, from a system input voltage on line 101. There are a number of ways the voltage may be controlled, based on load and operating temperature, as described above for the embodiment of FIG. 3. Generally, the voltage may be lowered for a lower clock rate, thereby saving power use and further temperature increase, as long as the operating voltage is kept high enough for reliable operation.

Voltage control may similarly be accomplished in a variety of ways. For example, a selection of voltage levels may be provided to controller 65, which may then switch one or another according to decisions of the control circuitry relative to temperature information. Controller 65 may also operate another circuit for voltage management, which in turn would provide lowered voltages to different ones of the multiple processors in accordance with decisions of the control routines.

The control routines necessary to facilitate different embodiments of the present invention may be stored in a variety of ways, and executed also in a variety of ways. Control routines for load and clock management according to various embodiments of the invention may a part of a system BIOS, for example, and may be executed by the system CPU microprocessor. In the case of multiple-processor systems, any one of the multiple processors may be designated the operating unit for temperature and load management.

Figure 6:
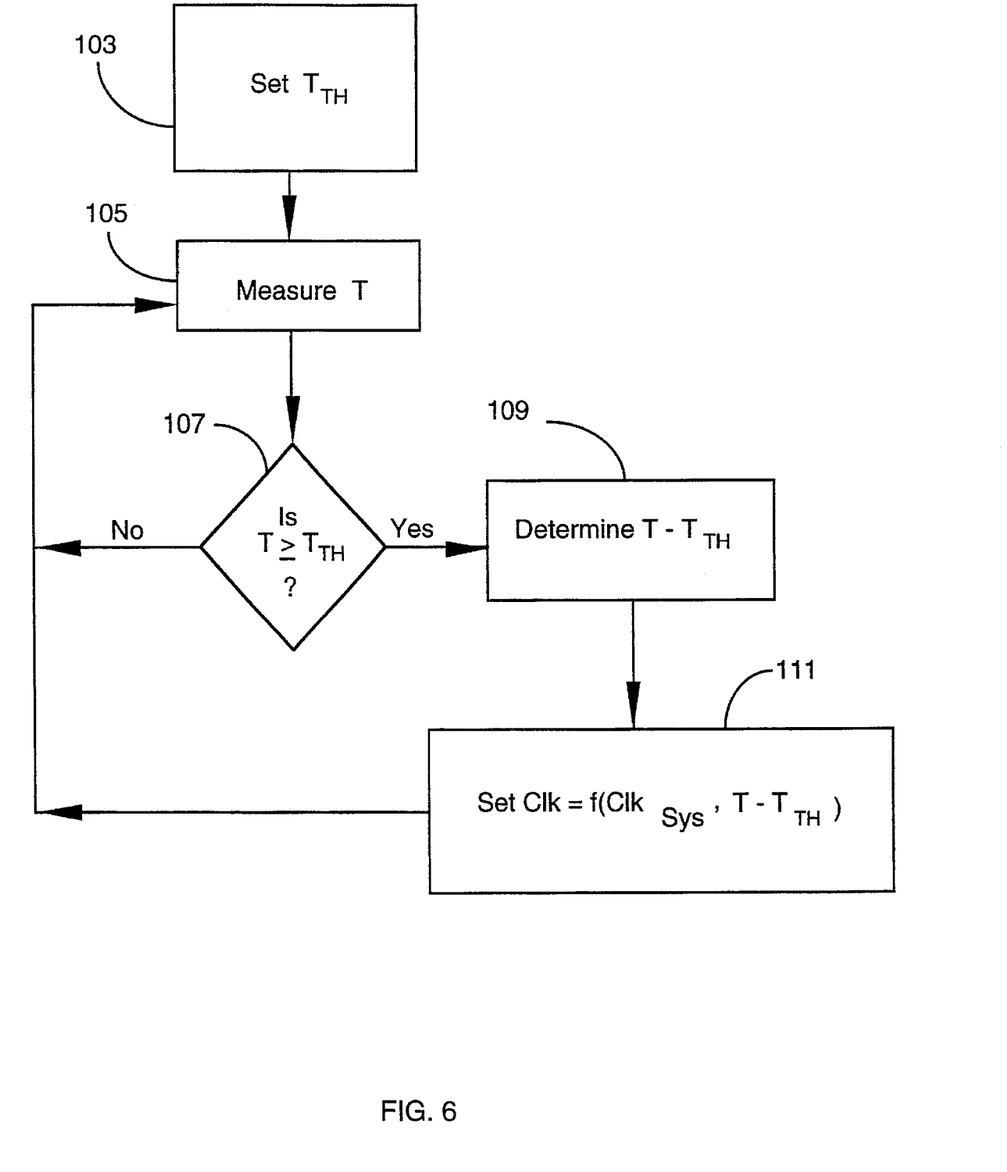
FIG. 6 is a logic flow diagram of a control routine useful in an embodiment of the invention.

FIG. 6 is a flow diagram for a general control routine applicable to controlling temperature buildup in either an area (functional unit) or a complete IC, depending on how temperature sensors are arranged and how clock circuitry is provided. Firstly there needs to be a programmable variable $T_{TH}$, which is the threshold temperature below which no reduction in clock rate (clk) is to occur. Secondly, there needs to be a relationship (function) defining the reduction in clk to the affected element or area relative to the system clock rate ($clk_{SYS}$), in this case illustrated by clk=f($clk_{SYS}$, $T-T_{TH}$).

At step 103 in FIG. 6, a user or programmer sets $T_{TH}$. In some embodiments, this value is preprogrammed, and in others, it may be a variable accessible to the user to be set. At step 105 temperature T is measured for an area or component. At step 107 it is determined whether T is equal to or greater than $T_{TH}$. If the temperature is below $T_{TH}$ control loops back to steps 105. If T is at or above $T-T_{TH}$, control goes to step 109 where the magnitude of $T-T_{TH}$ is determined. At step 111 clk is set as a function of the system clock rate $clk_{SYS}$ and the magnitude of the difference in T and $T_{TH}$. Control then loops back again to step 105.

It will be apparent to one with skill in the art that there is a broad variety of functional possibilities for setting clk in accordance with temperature. Also, as was described above, operating voltage may be lowered as clk is lowered to provide a further benefit in temperature management and power usage.

It will be apparent to one with skill in the art that there are many changes that might be made without departing from the spirit and scope of the invention. Several alternatives have been described above. For example, multiple temperature sensors may be provided to sense temperatures of different functional areas on a single IC, such as a microprocessor. Alternatively, clock rate may be controlled to an entire IC based on the output of a single temperature sensor, which may be mounted on an existing IC. This embodiment is useful for application to existing circuits and PC boards.

There are similarly many algorithms that may be incorporated to reduce clock rate as a function of temperature and system clock rate. There are also many ways control routines may be written to accomplish the purposes of the invention, and examples are provided above. There are many other alterations that may be made within the spirit and scope of the invention.

What is claimed is:

1. In a single integrated circuit (IC) chip having first and second functional circuits occupying distinct first and second regions of the chip, a system for selective regional temperature control, comprising:

a first temperature sensor within the region of the first functional circuit and a first clock rate adjusting circuit supplying operational frequency to the first functional circuit;

a second temperature sensor within the region of the second functional circuit and a second clock rate adjusting circuit supplying operational frequency to the second functional circuit; and logic control circuitry connected to the first and second temperature sensors and to the first and second clock rate adjusting circuits;

wherein the logic control circuitry signals the first clock rate adjusting circuit to lower clock rate to the first functional circuit in response to increasing temperature sensed by the first temperature sensor, and signals the second clock rate adjusting circuit to lower clock rate to the second functional circuit in response to increasing temperature sensed by the second temperature sensor.

2. A system as in claim 1 wherein the single IC chip is a microprocessor.

3. A system as in claim 1 wherein the first and second temperature sensors comprise solid-state circuitry implemented in the first and second regions of the chip, respectively.

4. A system as in claim 1 further comprising power control circuitry connected to the first and second functional circuits and to the logic control circuitry, wherein the logic control circuitry adjusts voltage to the first functional circuit as a function of the clock frequency provided to the first functional circuit, and adjusts voltage to the second functional circuit as a function of the clock frequency provided to the second functional circuit.

5. A system for controlling temperature of individual microprocessors in a multiprocessor system, wherein the microprocessors are interconnected by a bus, comprising:
   a first temperature sensor in contact with a first microprocessor in the multiprocessor system;
   a second temperature sensor in contact with a second microprocessor in the multiprocessor system;
   a bus controller connected to the bus; and
   logic control circuitry connected to the first and second temperature sensors and to the bus control circuitry;
   wherein the logic control circuitry monitors the temperature of the first and second microprocessors, and signals the bus controller to route microprocessor tasks preferentially to the microprocessor at the lower temperature.

6. A system as in claim 5 further comprising clock frequency adjusting circuitry connected to the logic control circuitry and to the first and second microprocessors, wherein the logic control circuitry signals the clock frequency adjusting circuitry to lower clock frequency individually to the microprocessors as a function of increasing temperature.

7. A system as in claim 6 further comprising power control circuitry connected to the first and second microprocessors and to the logic control circuitry, wherein the logic control circuitry signals the power control circuitry to lower operating voltage to microprocessors individually in conjunction with lowering clock frequency.

8. A method for selective regional temperature control in a microprocessor chip having first and second distinct functional circuits occupying distinct first and second regions of the chip respectively, comprising steps of:
   (a) sensing the temperature of the first region with a first temperature sensor within the first region, and of the second region with a second temperature sensor within the second region;
   (b) providing an indication of the temperature of each region to a logic control circuit connected to a clock rate adjusting circuit in turn connected to the first and second functional circuits; and
   (c) altering clock rate to the first and second functional circuits individually as a function of the temperature indicated by the first and second temperature sensors respectively.

9. The method of claim 8 wherein the first and second temperature sensors comprise solid-state circuitry implemented in the first and second regions respectively.

10. The method of claim 8 further comprising a step for adjusting operating voltage provided to each functional circuit as a function of the altered clock rate.

11. A method for controlling temperature of individual microprocessors in a multiprocessor system, wherein the microprocessors are interconnected by a bus, comprising steps of:
   (a) sensing temperature of individual microprocessors in the multiprocessor system;
   (b) reporting the sensed temperatures to a logic control circuit; and
   (c) signalling a bus controller connected to the bus to route microprocessor tasks preferentially to microprocessors at the lowest temperatures.

12. The method of claim 11 further comprising a step for lowering clock frequency to microprocessors as a function of increasing temperature.

13. The method of claim 12 further comprising a step for lowering operating voltage to microprocessors in conjunction with lowering operating clock frequency.

* * * * *